(12) United States Patent
Sichert et al.

(10) Patent No.: US 7,554,875 B2
(45) Date of Patent: Jun. 30, 2009

(54) BUS STRUCTURE, MEMORY CHIP AND INTEGRATED CIRCUIT

(75) Inventors: Christian Sichert, Munich (DE); Rainer Bartenschlager, Kaufbeuren (DE); Jens Polney, Munich (DE)

(73) Assignee: Qimonda AG, Munich (DE)

( * ) Notice: Subject to any disclaimer, the term of this patent is extended or adjusted under 35 U.S.C. 154(b) by 330 days.

(21) Appl. No.: 11/700,399

(22) Filed: Jan. 31, 2007

(65) Prior Publication Data

US 2008/0181044 A1      Jul. 31, 2008

(51) Int. Cl.
*G11C 8/00*     (2006.01)
(52) U.S. Cl. .................. 365/230.06; 365/198; 365/191
(58) Field of Classification Search ............ 365/230.06, 365/198, 191
See application file for complete search history.

(56) References Cited

U.S. PATENT DOCUMENTS 6,122,217 A * 9/2000 Keeth et al. ............. 365/230.03
6,445,626 B1 * 9/2002 Hsu et al. .................... 365/200

* cited by examiner

*Primary Examiner*—Pho M. Luu
*Assistant Examiner*—Tha-O Bui
(74) *Attorney, Agent, or Firm*—Slater & Matsil, L.L.P.

(57) ABSTRACT

A bus structure comprises a plurality of driver circuits, each driver circuit comprising an input for a first signal and a terminal for an output signal wherein each driver circuit is capable of providing the output signal at the terminal upon receipt of the first signal, a parallel bus comprising a plurality of output signal lines at a receiving end, being connectable to a target component, each of the signal lines extending at least from the receiving end to the terminal of a different one of the plurality of driver circuits, such that a length of the output signal line between the receiving end and the respective driver circuits decreases in a connection order among the plurality of driver circuits, and a signal line coupled to each of the inputs of the driver circuits in the connection order.

23 Claims, 5 Drawing Sheets

BUS STRUCTURE, MEMORY CHIP AND INTEGRATED CIRCUIT

TECHNICAL FIELD

An embodiment of the present invention relates to a bus structure, which can, for instance, be integrated into a memory chip, or an integrated circuit to be implemented in modem computer systems and other information technology-related applications.

BACKGROUND

Many modem computer architectures and information technology-related architectures comprise parallel data bus systems and other parallel bus structures, which are implemented to transport data, commands, status information and other pieces of information from one component to another. Examples do not only come from all over the field of computer technology, for instance from the field of inter-computer communication, such as via an external parallel port, but also from intra-computer communication, such as a communication between different components of a computer system, e.g., between a hard disk and a mass memory storage controller. Further examples can be derived from the field of intra-component communication such as the communication between individual memory devices and a buffer, or an intermediate communication device integrated along with the individual memory devices on a single memory module.

However, parallel bus structures are not only employed in the field of extra-chip communication as described above, but also inside individual chips and devices, which are then coupled via parallel bus structures as described above, to one another. Such bus structures are, for instance, used to transport data, commands, status signals and other pieces of information from an interface to a device-internal or chip-internal section, which is capable of storing, processing or otherwise manipulating the data, signals or other pieces of (encoded) information.

As an example, in DRAM devices (DRAM=Dynamic Random Access Memory) data busses are used to transport the data to be stored in the DRAM device from the input/output interfaces (IO) to the memory array of the DRAM device during a write operation (WRITE) and the data stored in the DRAM device from the memory array to the input/output interface during a read operation (READ).

With the ever-growing demand for larger memory capacities and the ever-growing demand for larger data processing capabilities, a key issue for bus structures becomes the speed at which data, signals and other pieces of information can be transported over the respective bus structures. Especially in the case of a parallel bus structure, for high-speed operations, it is necessary to reduce the skew between the different signal lines of the bus, which carry the different bits to be transported. Each of these different signal lines of the bus are very often connected to different, and hence, spatially distributed drivers or driver circuits.

Particularly, in the case of a read operation, in which the different pieces of information or bits which run on the different signal lines of the bus will be latched with only one signal indicating a read-finished state, the challenge of controlling and limiting the skew between the different signal lines of a bus becomes very important. Current solutions in the field of memory devices comprise no special method of reducing the skew on the busses which leads to a tracking of the signal indicating that the read operation is finished with the signals or bits being transmitted over the bus, as not being optimal.

SUMMARY OF THE INVENTION

According to an embodiment of the present invention, a bus structure comprises a plurality of driver circuits, each driver circuit comprising an input for a first signal and a terminal for an output signal. Each driver circuit is capable of providing the output signal at the terminal upon receipt of the first signal. A parallel bus comprising a plurality of output signal lines at a receiving end, being connectable to a target component, each of the signal lines extending at least from the receiving end to the terminal of a different one of the plurality of driver circuits, such that a length of the output signal line between the receiving end and the respective driver circuit of the plurality of driver circuits decreases in the connection order among the plurality of driver circuits, and a signal line coupled to each of the inputs of the driver circuits of the plurality of driver circuits in the connection order.

According to a further embodiment of the present invention, a memory chip comprises a memory array with a plurality of memory array terminals, a plurality of driver circuits, each driver circuit comprising an input for a first signal, a terminal for an output signal and a further terminal coupled to one memory array terminal of the plurality of memory array terminals, such that each driver circuit of a plurality of driver circuits is coupled to a respective memory array terminal of the plurality of memory terminals. Each driver circuit is capable of providing the output signal at the terminal upon receipt of the first signal, a parallel data bus having a plurality of output signal lines and a receiving end being connectable to a target component, each output signal line extending at least from the receiving end to the terminal of a different one of the plurality of driver circuits such that the length of the output signal line between the receiving line and the respective driver circuit of the plurality of driver circuits decreases in a connection order among the plurality of driver circuits, and a signal line coupled to each of the inputs of the driver circuits in the connection order, wherein the memory chip is integrated into a single chip.

According to a further embodiment of the present invention, an embodiment of an integrated circuit comprises a plurality of driver circuits, each driver circuit comprising an input for a first signal and a terminal for an output signal. Each driver circuit is capable of providing the output signal at the terminal upon receipt of the first signal, a target component being part of an interface for an external communication, a parallel bus comprising a plurality of output signal lines with a receiving end and being coupled to the target component. Each of the signal lines extend at least from the receiving end to the terminal of a different one of the plurality of driver circuits such that a length of the output signal line between the receiving end and the respective driver circuit of the plurality of driver circuits decreases in a connection order among the plurality of driver circuits and a signal line coupled to each of the inputs of the driver circuits of the plurality of the driver circuits in the connection order. A length of the signal line between different driver circuits of a plurality of driver circuits corresponds to a difference of the lengths of the respective driver circuits with respect to the receiving end such that the signal propagation time of the first signal on the signal line between two different driver circuits of the plurality of driver circuits corresponds to a difference of the propagation delays of the respective output signals on the respective output signal lines of the respective driver circuits.

BRIEF DESCRIPTION OF THE DRAWINGS

Embodiments of the present invention are described hereinafter, making reference to the appended drawings.

DETAILED DESCRIPTION OF ILLUSTRATIVE EMBODIMENTS

FIGS. 1a to 3 show different block diagrams of embodiments of a bus structure, a memory chip and an integrated circuit, as well as a possible solution of a memory chip and a corresponding embodiment of a memory chip. Before further embodiments of a memory chip are described and compared to a possible solution with respect to FIGS. 2 and 3, and with respect to FIGS. 1a to 1c, embodiments of a bus structure, a memory chip and an integrated circuit will be outlined in more detail.

Figure 1A:
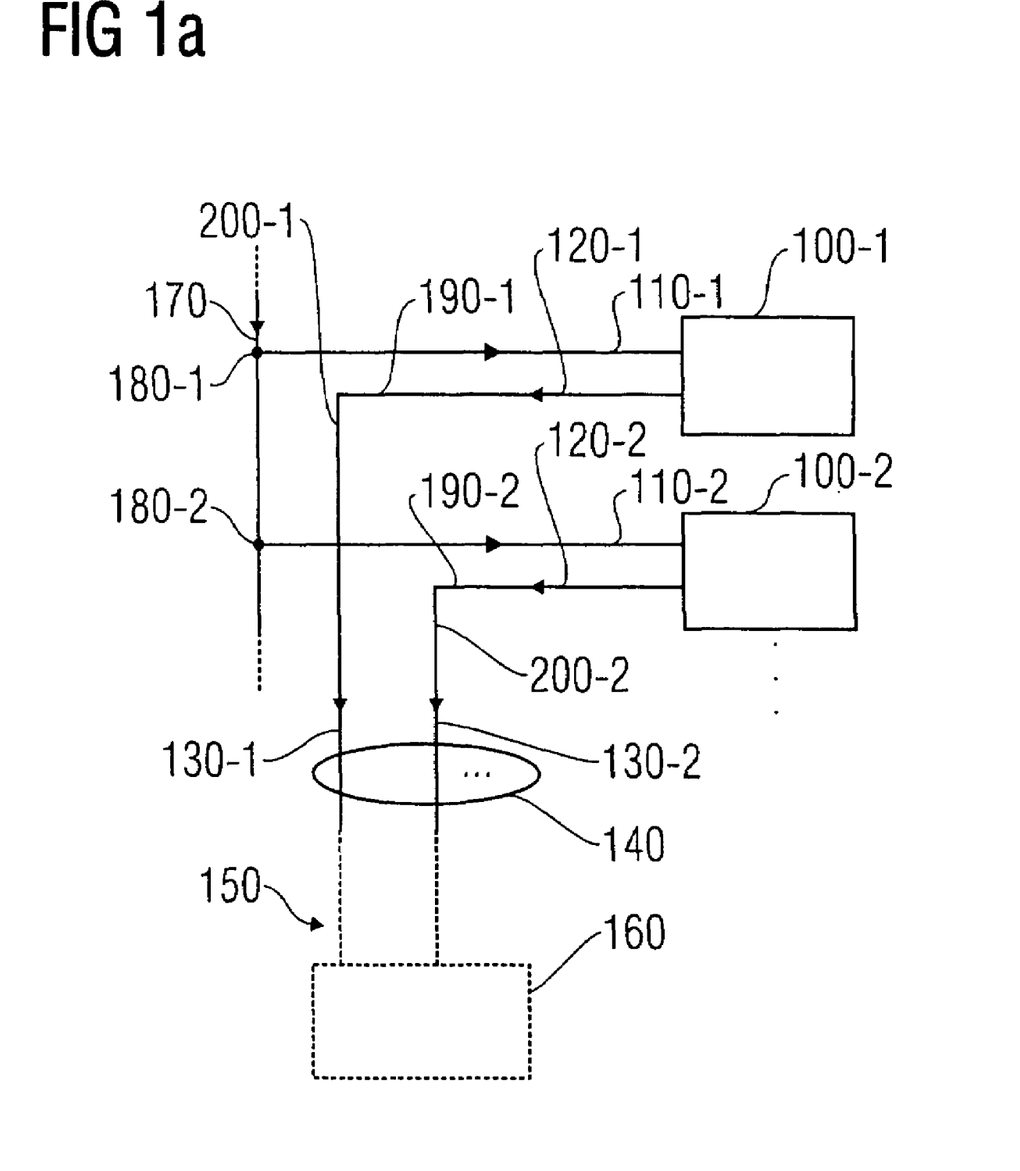
FIG. 1a shows a block diagram of an embodiment of a bus structure.

FIG. 1a shows a schematic block diagram of a bus structure with a plurality of driver circuits 100. To be more precise, the bus structure shown in FIG. 1a comprises a first driver circuit 100-1 and a second driver circuit 100-2. However, the embodiment may comprise further driver circuits.

As introduced in the context of the driver circuits 100, the following summarized reference signs will be used for components, circuits and other objects appearing more than once in a figure or more than once in several figures, unless a specific component, circuit or object is referred to. In other words, as an example, the reference sign 100 refers to any of the driver circuits or any of a subset of the driver circuits wherein the reference signs 100-1, 100-2, . . . refer to the specific driver circuits.

Each of the driver circuits 100 comprises an input 110 for a first signal and a terminal 120 for an output signal, wherein each of the inputs 110 and each of the terminals 120 is labeled with a reference sign in FIG. 1a, according to the corresponding driver circuit 100. In other words, the input for the first driver circuit 100-1 is labeled with the reference sign 110-1. Accordingly, the other inputs 110 and terminals 120 are labeled in FIG. 1a as inputs 110-1 and 110-2, and the terminals as 120-1 and 120-2 according to the corresponding driver circuits 100.

Each of the terminals 120 is coupled to a signal line 130 of a parallel bus 140. To be more precise, a first output signal line 130-1 is connected to the terminal 120-1 of the first driver circuit 100-1, whereas a second output signal line 130-2 is connected to the terminal 120-2 of the second driver circuit 100-2, and so on. Depending on the concrete implementation, the parallel bus 140 can in principle, comprise N output signal lines 130, which are connected to an appropriate number of driver circuits 100, wherein N is a positive integer. Depending on the concrete implementation and application, typical values for N is in the range between 8 and 1024, wherein typical values comprise 16, 32, 64, 128, 256 and 512.

However, it should be noted that the parallel bus 140 can also comprise more than N output signal lines 130, which can for instance, be employed to transport further signals. Examples for these further signals are a reference potential (ground; GND), further positive and/or negative supply voltages or currents, synchronization signals, command signals and status signals, among other signals to be transported over the parallel bus 140.

In FIG. 1a, the output signal lines 130 are shown accompanied by an arrow indicating the direction of the signals carried on the respective signal lines in a mode or state of operations. However, this is not to be understood in a limiting sense. Depending on the concrete implementations, signals can travel in both directions along individual output signal lines 130, provided that the parallel bus 140 is not a unidirectional bus. In other words, the arrows shown in FIG. 1a only indicate the direction of the signals in a considered state of operations. In other states, signals may also propagate in one or more other directions (e.g., T-like structures).

Furthermore, in FIG. 1a, as well as in further figures of the present application, the arrows shown in the context of signal lines in general only indicate the direction of the signals in a considered state of operation, which does not rule out the possibility of a signal or more signals traveling in other directions along the signal lines in other states of operation.

The driver circuits 100 are capable of providing the output signal at their respective terminals 120 upon receipt of the first signal, which is also referred to as the triggering signal. The output signal can be based on a further signal provided to the driver circuit 100 via a further terminal, which is not shown in FIG. 1a. As a consequence, for example, the output signal can be derived from the further signal provided to the further terminal of the driver circuit 100 with an improved quality, e.g., an elevated signal amplitude, which is provided to the terminal 120 and hence to the output signal line 130 upon receipt of a first signal at the input 110. In other words, the driver circuit 100 is capable of providing the output signal at the terminal 120 upon receipt of the first signal at the input 110 optionally in an enhanced or modified version when compared to the further signal received at the further terminal not shown in FIG. 1a. In other words, the driver circuit 100 can comprise the functionality of a latch.

The parallel bus 140 is connectable via a receiving end 150 to an optional target component 160, to which the signals provided by the driver circuits 100 are to be transported to. The receiving end 150 of the parallel bus 140 can in principle be a terminal, a connector, or any other device or component through which the parallel bus 140 can be coupled to the target component 160. However, the receiving end can, in principle, be a point on the structure comprising the parallel bus structure 140. In this context, it should be noted that a component being coupled to another component can either be directly connected to each other, e.g., via a wire or another conducting structure, or indirectly via an additional component, e.g., a resistor, a signal repeater, or another signal influencing or signal manipulating device.

The target component 160 can, for instance, be an interface or a part of an interface for an external communication, a circuit or device to adapt different protocols, for instance, a UART (UART=Universal Asynchronous Receiver Transmitter), which is frequently employed to transform a parallel data stream into a serial data stream and vice-versa. However, other circuits and devices can also be employed as the target component 160.

A signal line 170 or a triggering signal line 170 for the first signal is coupled to each of the inputs 110 of the driver circuit in a connection order with respect to an incoming first signal or an incoming triggering signal. The connection order is also reflected considering the length of the output signal lines 130 between the terminals 120 of the corresponding driver circuits 100 and the receiving end 150 of the parallel bus 140 in such a way that the length of the output signal lines 130 between the terminal 120 of the corresponding driver circuit 100 and the receiving end 150 of the parallel bus 140 decrease in the connection order among the plurality of driver circuits 100, which defines the connection order in the framework of the present application.

As a consequence of the signal line 170 being coupled to the inputs 110 of the driver circuits 100 in the connection order with respect to the incoming first signal on the signal line 170, the first signal reaches the individual driver circuits 100 also in the connection order. Provided that the internal delays of the driver circuits 100 between receiving the first signal via the input 110 and providing the output signal at the terminal 120 are comparable, this means that the driver circuits 100 provide their respective output signals to the output signal lines 130 also in the connection order. Moreover, as the connection order often reflects the length of the output signal lines 130 between the receiving end 150 and the respective driver circuits 100 in a decreasing order, the delay caused by the first signal arriving at the driver circuits 100 in the connection order can be fully or at least partially compensated, due to the signal propagation velocity on the output signal lines 130 due to the decreasing lengths of the corresponding output signal lines 130 between the terminal 120 and the receiving end of the parallel bus 140. As a consequence, the time delay or skew between the different signals on the different output signal lines 130 of the parallel bus 140 is significantly reduced or even completely avoided.

As previously mentioned, provided that the internal delays of the driver circuits 100 between receiving the first signal at the input 110 and providing the output signal at the terminal 120 is comparable among the driver circuits 100, in the sense, that the maximum of the differences of the internal delays does not differ from the maximum of the internal delays by more than 50% or typically more than 20%, the skew of the signals propagating along the output signal lines 130, can in principle be completely avoided if the length of the signal line 170 between two different driver circuits 100, e.g., between the driver circuit 100-1 and 100-2, corresponds to the difference of the lengths of the output signal lines 130 with respect to the receiving end 150 of the respective driver circuits 100, provided that the propagation velocity along the output signal lines 130 of the parallel bus 140 and the propagation velocity of a signal on the signal line 170 are comparable.

In other words, as the signal line 170 is coupled to the driver circuits 100 in the connection order and the length of the output signal lines 130 between the receiving end 150 and the terminal 120 of the respective driver circuit 100 decreases in the connection order, the propagation delay of the first signal on the signal line between two different driver circuits of the plurality of driver circuits 100 corresponds to a difference of the signal propagation delay between the respective driver circuits 100 and the receiving end 150 so that the skew of the output signals on the output signal lines 130 can be minimized.

In this context it should be noted that propagation delays as well as lengths or differences in lengths corresponding to one another are not required to be equally the same. In the framework of the present application, under propagation delays, propagation velocities, lengths of signal lines and differences of lengths corresponding to one another are then understood, which are comparable to one another in the sense that their respective values are equal to one another within a predetermined and well-defined margin. Such a margin can, for instance, be defined to be less than or equal to +/−25% or +/−20% of the corresponding overall value. Alternatively, the margin can be defined to be +/−10% of the overall value.

In the embodiment shown in FIG. 1a, the signal line 170 comprises knots 180 from which a portion of the signal line 170 branches off to couple the inputs 110 of the driver circuits 100 to the signal line 170. Furthermore, each of the output signal lines 130 connecting the terminal 120 of the respective driver circuit 100 with the receiving end 150 of the parallel bus 140 comprises a first section 190 and a second section 200 of the corresponding output signal line 130. While the first section 190 of the output signal line 130 is arranged in parallel to the branched off sections of the signal line 170, the second section 200 of the output signal lines 130 is arranged in parallel to the non-branched-off sections of the signal line 170. Compared to a typical overall length of the longest output signal line 130 of parallel bus 140, the first sections 190 of the output signal lines 130 can be neglected in a good approximation. Typically, the length of the first section 190 of the output signal line 130 are smaller than approximately 20% or even 10% of the maximum overall length of the output signal lines 130. For example, while the maximum of the length of the output signal lines 130 can be in the range of several millimeters (e.g., 3 mm), the length of the first sections 190 is typically much less than 300 micrometers.

Hence, in the embodiment of the present invention shown in FIG. 1a, the first signal propagates on the signal line 170 in the same direction like the output signals on the second sections 200 of the output signal lines 130. In the embodiment of a bus structure shown in FIG. 1a, the length of the signal line 170 between two arbitrary knots 180 corresponds to the difference of the length of the output signal lines 130 of the corresponding driver circuits 100, being connected via the respective knots 180 apart from the first sections 190 of the corresponding output signal lines 130. However, for most of the driver circuits 100, especially for the first few driver circuits 100 with respect to the connection order, the length of the first sections 190 of the output signal lines 130 is comparably smaller than the lengths of the corresponding second sections 200. As a consequence, although not literally equal, in the embodiment shown in FIG. 1a, the difference of length of the signal line 170 between two driver circuits 100, i.e., between the corresponding knots 180, corresponds to the difference of the lengths of the appropriate output signal line 130.

However, in principle additional structures can be implemented into the output signal lines 130 and the signal line 170 or rather the branched-off portion of the signal line 170 to accommodate also for further differences concerning the propagation delay of the corresponding output signal lines and/or the signal line 170.

The first signal transported along the signal line 170 can, for instance, be supplied to the bus structure via an interface, of which, for example, the optional target component is a part of. As will be explained in more detail later on, in such a case the signal line 170 can be designed such that it comprises a U-shaped structure, depending on the concrete implementation. Furthermore, the first signal can also be provided to the signal line 170 via a further component, implemented into the same circuit as the embodiment of the bus structure. In this case, the first signal can for instance be a clock signal or a clock-like signal or another signal, which is created inside the same circuit also comprising the embodiment of the bus structure. In other words, the first signal initiating the output of the output signals via the parallel bus 140 can be created externally and provided to the circuit comprising the embodiment of the bus structure via an interface or a terminal, but it can also be created internally by an appropriate circuit.

Furthermore, an embodiment of a bus structure can be integrated into a single chip, such that, for instance, the target component 160 can be a circuit for a chip-external communication. In this case an embodiment of a bus structure offers chip-internal implementation of a path matching to eliminate or minimize the skew of the output signals carried via the output signal lines 130 of the parallel bus 140.

An advantage of an embodiment of a bus structure, as for instance shown in FIG. 1a, is that by connecting the signal line 170 carrying the first signal initiating the output of the output signals by the driver circuit in the connection order, as defined by the decreasing lengths of the output signal lines 130 with respect to the receiving end of the parallel bus 140, the skew or the propagation delay of the output signals of the output signal line 130 of the parallel bus 140, can be eliminated or at least minimized. As a consequence, especially in the case of a high-speed operation, the synchronization of the output signals as provided to the optional target component 160 can be significantly reduced.

As an example, compared to a possible solution in which the signals transferred to the target component 160 comprise a significant skew, so that in the case of a memory system, a synchronization signal indicating a read-finish state is not required to be implemented to latch the output signals provided to the target component to an external or chip-external system, as will be explained in the context of an embodiment of a memory chip and an embodiment of an integrated circuit.

Before describing a further embodiment of the present invention in more detail, it should be noted that structures, components, circuits and objects with the same or similar functional properties are denoted with the same reference signs. Unless explicitly noted otherwise, the description with respect to objects, structures, circuits and components with similar or equal functional properties and features can be exchanged with respect to each other. Furthermore, in the following, as previously outlined, summarized reference signs are used for objects, structures, circuits and components, which are identical or similar in one embodiment or appear in more than one of the figures, unless properties or features of a specific object, structure, circuit or component are discussed. Using summarized reference signs thereby enables as indicated before, a more compact and clearer description of embodiments of the present invention.

Figure 1B:
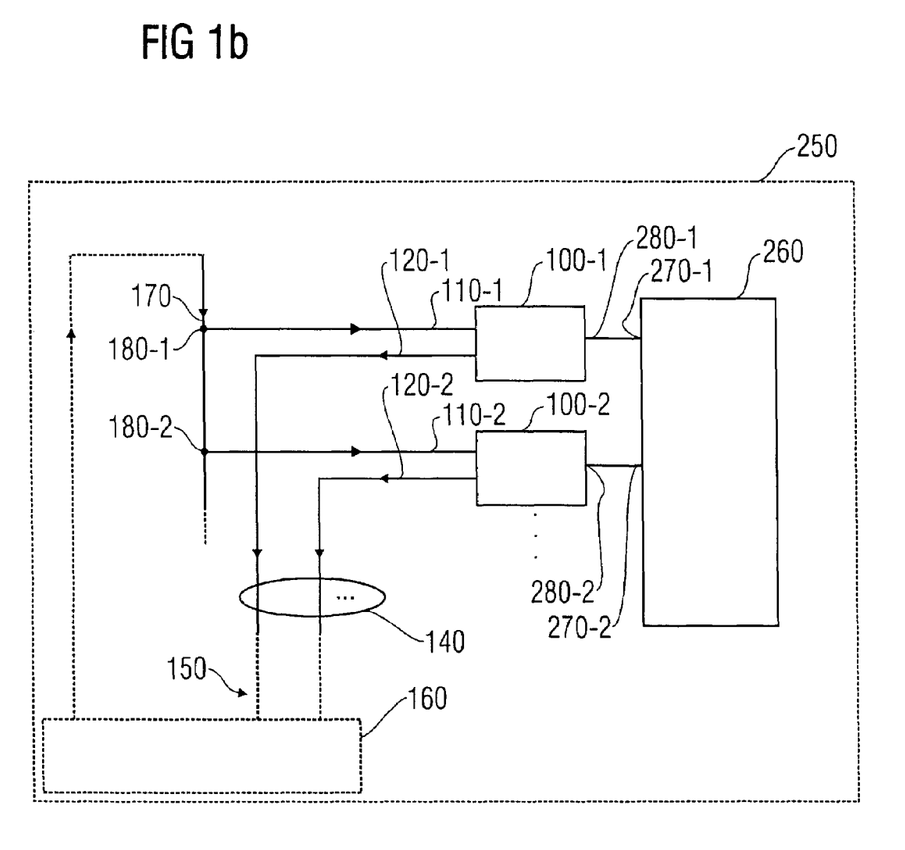
FIG. 1b shows a block diagram of an embodiment of a memory chip.

FIG. 1b shows a block diagram of an embodiment of a memory chip 250 which comprises, apart from the components as described in the context of FIG. 1a, a memory array 260 with a plurality of memory array terminals 270-1, 270-2, . . . , which are coupled to the driver circuits 100 via further terminals 280 of the driver circuits. In the case of the embodiment shown in FIG. 1b, each driver circuit 100 of the plurality of driver circuits 100 is coupled to a respective memory array terminal 270 of a plurality of memory array terminals. Optionally, each driver circuit 100 is capable of providing the signal received at the respective further terminal 280, which is also referred to as the a memory signal, in a modified or enhanced manner as the output signal at the terminal 120 upon receipt of the first signal at the input 110 frame the signal line 170. Moreover, in embodiments of a memory chip 250, the driver circuits 100 and the memory array 260 are coupled via the further terminals 280 and the memory array terminal 270 to enable an exchange of data to be stored in or to be read from the memory array via the driver circuit 100 and the target component being connectable to the receiving end of the parallel bus 140. As a consequence, the driver circuit 100 is capable of providing signals received from the memory array 260 via its memory array terminals 270 to the output signal lines 130 of the parallel bus 140 upon receipt of the first signal (triggering signal) provided to the driver circuits 100 via the signal line 170. As already explained in the context of the embodiment of the bus structure in FIG. 1a, by providing the first signal to the driver circuits 100 in the connection order, as defined by the decreasing lengths of the output signal lines 130 of the respective driver circuits 100 with respect to the receiving end 150 of the parallel bus 140, the skew of the output signals on the output signal lines 130 with respect to each other, can be avoided, or at least be significantly reduced. Thereby, synchronization schemes in the optional target component 160 being connectable to the receiving end 150 of the parallel bus 140 can be significantly simplified or even be completely dropped.

The target component 160 can, for instance, comprise in the case of an embodiment of a memory chip 250, necessary input/output interface components for a chip-external communication with other components of the computer system. Among other components and circuits, the target component 160 may also comprise circuits for adapting the signal levels of the signals to be sent to chip-external components, as well as buffering circuits.

In the case of a DRAM device or a DRAM memory chip (DRAM=Dynamic Random Access Memory), the memory array 260 typically comprises apart from the DRAM memory cell (typically a transistor along with a capacitor) also circuits for coding or decoding address information. Here, the parallel bus or data bus 140 is used to transport data in the form of signals from the input/output interfaces (IO) to the memory array during a write process (WRITE) and from the memory array to the IO interface during a read operation (READ). Especially, in the case of high-speed operations, it is advisable to reduce the skew between the different signals or bits of the parallel data bus, which comprises distributed drivers or driver circuits 100, as shown in FIG. 1b. Especially in the case of a read process, in which the signals carrying different pieces of information will propagate or run on the output signal lines 130 of the bus 140 towards the receiving end 150 and the target component 160, reducing, minimizing or even completely avoiding the skew of the output signals on the output signal lines 130 is a key issue, as all the signals on the parallel bus 140 can be latched with respect to the target component 160 or rather the IO interface with only one signal indicating a read-finished state.

The significant reduction or complete elimination of the skew of the output signals on the parallel bus 140 is, as explained above, achieved by coupling the inputs 110 of the driver circuits 100 in the connection order, which is defined by the decreasing lengths of the respective output signal lines 130, coupled to the terminals 120 of the respective driver circuit 100 with respect to the receiving end 150. If, for instance as an option, the first signal is provided via the target component 160 as a part of the IO interface, the first signal can be provided to the driver circuits 100 via an essentially U-shaped signal line 170, as depicted by the dashed line in FIG. 1b.

To be more precise, in this case, the signal line 170 comprises a first portion, which is arranged parallel and neighboring to the output signal lines 130 of the parallel bus 140. Furthermore, the signal line 170 also comprises in this case a further section or portion so that essentially the U-shaped layout of the signal line 170 is realized.

In other words, the driving direction of the first signal, which is also referred to as the read start signal in the case of an embodiment of a memory chip 250, is rotated by 180°. As a consequence, the propagation direction of the first signal on the signal line 170 has (essentially) the same direction as the output signals on the data bus or the parallel bus 140. To avoid unnecessary repetitions with respect to further layout details and considerations concerning propagation delays, lengths of signal lines reference is hereby made to the corresponding sections concerning the description of the embodiment shown in FIG. 1a.

Figure 1C:
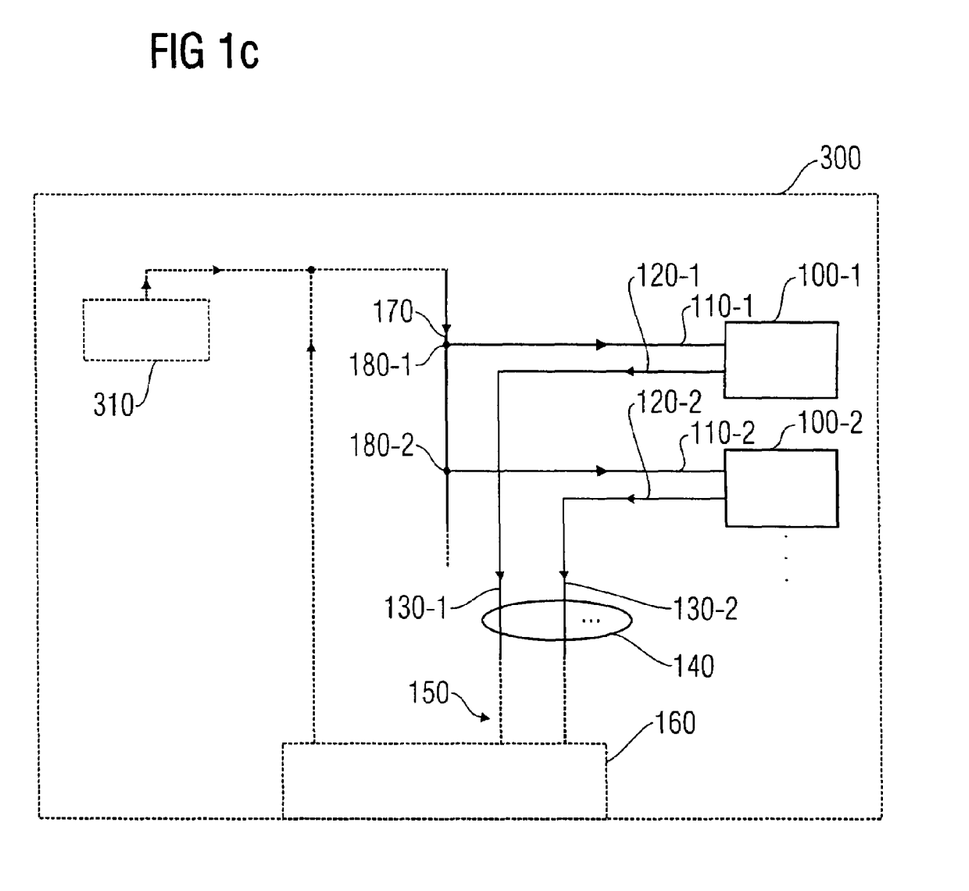
FIG. 1c shows a block diagram of an embodiment of an integrated circuit.

FIG. 1c shows a block diagram of an embodiment of an integrated circuit 300. The embodiment of the integrated circuit 300 differs with respect to the circuits, components and objects already explained in the context of the embodiment of the bus structure in FIG. 1a, only with respect to the target component 160, which is, in the case of the embodiment of the integrated circuit 300, part of an interface for an external communication, which is no longer an optional component. As a consequence, the receiving end of the parallel bus 140 coincides with the terminals at which the output signal lines 130 of the parallel bus 140 are coupled to the target component 160. Hence, reference is hereby made to the corresponding sections of the description concerning the embodiment of the bus structure shown in FIG. 1a. Also with respect to the issue of propagation delays, the lengths of the signal lines, as well as differences of lengths of the signal lines, reference is made to the corresponding description with respect to the embodiments shown in FIGS. 1a and 1b.

The first signal triggering the driver circuits 100 is provided to the driving circuits 100 via the signal line 170. As explained earlier, the first signal of the triggering signal can be provided to the integrated circuit 300 externally or created internally. In the first case, the first signal can, for instance, be externally provided to the target component 160 and transported via an essentially U-shaped signal line 170 as indicated by the partially dashed signal line 170. As previously explained in the context of FIGS. 1a and 1b, by employing the U-shaped signal lines 170, the connection order, in which the driving circuits 100 are connected to the signal line 170 is such that the lengths of the output signal lines 130 coupling the target component 160 with the terminals 120 of the respective driver circuits 100 decreases.

In the latter case, the embodiment of integrated circuit 300 may additionally comprise an optional internal circuit 310, which is capable of providing the first signal (triggering signal), depending on the condition or the state that the embodiment of the integrated circuit 300 is in. As both, the externally supplied as well as the internally created first signals are optional components, the corresponding portions of the signal line 170 and in the latter case, the internal circuit 310, are shown in FIG. 1c as optional components (dashed lines). Furthermore, it should be noted that the output signal lines 130 of the parallel bus 140 can be both, unidirectional and bidirectional signal lines. In the case of a unidirectional parallel bus with directional signal lines 130, the arrows in FIG. 1a to 1c indicate the direction of the propagation of the signals. In the case of a bidirectional bus 140, the arrows represent only the propagation direction of the signals in the case of a read operation.

In other words, the arrows in FIG. 1a to 1c do not represent a limit with respect to the embodiments of the present invention described thus far, and in the following section of the present application. To be more precise, the output signal lines 130 of the parallel bus 140 are not limited to be used to transport signals from the driver circuits 100 to the target components 160 (or the receiving end 150 of the parallel bus 140), but can also be used to transport signals in the opposite direction, namely to the driver circuits 100, which might comprise in this case, also sensing circuits for receiving the signals transmitted towards the driving circuit 100 and optionally for adapting the respective signals further, depending on the embodiment.

To illustrate the advantages of employing an embodiment of a bus structure, a memory chip or an integrated circuit further, in the following sections a comparison of a possible solution of a memory chip is described and compared to an embodiment of a memory chip according to the present invention.

Figure 2:
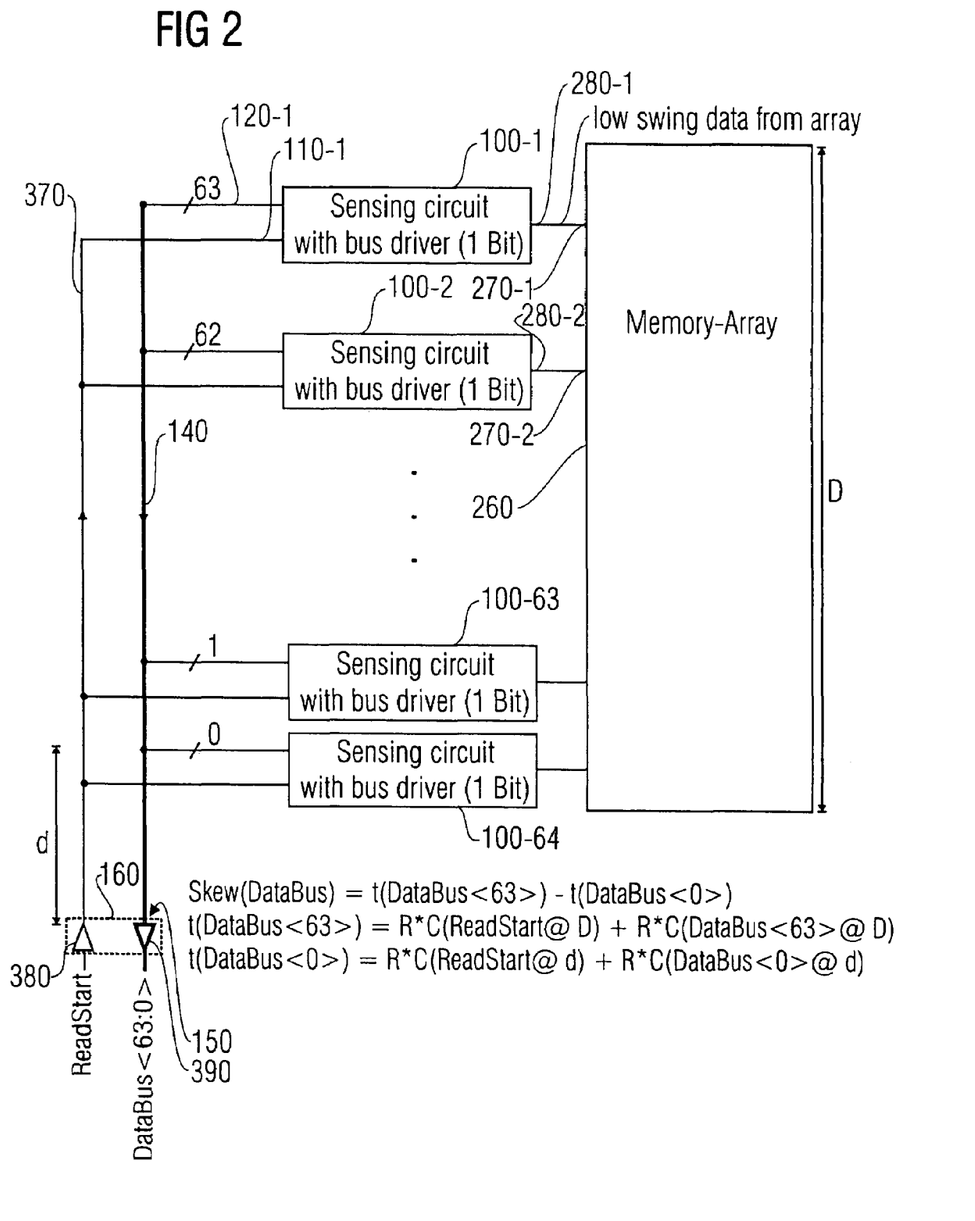
FIG. 2 shows a block diagram of a possible solution of a memory chip.

FIG. 2 shows a block diagram of a possible solution of a memory chip with N=64 output signal lines (130 in FIG. 1) comprised in the data bus or the parallel bus 140. Each of the output signal lines 130 of the data bus 140 corresponds to a bit address in the range from 0 to (N−1), or to be more precise, in the case of N=64 in the range from 0-63, as indicated by the figures and the expression <63:0>. Furthermore, the bit address of an output signal line of the data bus 140 differ from the connection order as defined by the lengths of the output signal lines with respect to the target component 160 by the fact that the bit address decreases from its starting value (N−1)=63 in the connection order, apart from the additional offset of 1 caused by beginning the bit address with bit address 0.

In other words, although the first driver circuit 100-1 is with respect to the length of the corresponding output signal line 130-1 (not shown in FIG. 2) the first driver circuit 100 in the previously defined connection order, the driver circuit 100-1 corresponds to the bit address (N−1)=63.

Accordingly, the last driver circuit 100-64 in the connection order corresponds to the bit address 0.

The driver circuits 100 are furthermore capable of transforming the low swing data or rather the low swing signals provided by the memory array 260 to the further terminals 280 of the driver circuit 100 to output signals with an adapted signal level. In other words, the driver circuits 100 further comprise a sensing circuit each (for one bit) to enable amplification of the low swing data from the memory array 260 to obtain the output data with an increase signal level to be provided to the data bus 140 upon receipt of the first signal or read start signal over the signal line 370. Although not explicitly mentioned in the context of the embodiments shown in FIGS. 1a to 1c, each driver circuit 100 is capable of providing one output signal indicative of one bit. In yet other words, the driver circuits 100 are here sensing circuits with a bus driver for on bit.

Furthermore, the target component 160, to which both the data bus 160 as well as the signal line 370 is connected, comprises an amplifier 380 coupled to the signal line 370 and a bus amplifier 390 coupled to the parallel bus 140. To be more precise, the signal line 370 is connected to an output of the amplifier 380 so that a read start signal received by the target component 160 can be adjusted with respect to the signal quality (e.g., the signal level). Accordingly, the bus amplifier 390 is connected to the parallel bus 140 in order to improve the signal quality or to adjust the signal quality (e.g., the signal level) of the output signals provided via the parallel bus 140 to the target component 160 inside the memory chip to the resulting signals for transfer to further components. Optionally, both the amplifier 380 as well as the bus amplifier 390 may be capable of buffering data or latching signals to provide an appropriate signal synchronization.

However, the most significant difference between the possible solution of the memory chip shown in FIG. 2 and the embodiment shown in FIG. 1b, is the layout of the signal line 370 as compared to the signal line 170 and the resulting connection order of the signal lines. To be more precise, the signal line 370 is coupled to each of the inputs 110 of the driver circuits 100 in the reverse connection order as previously defined. As a consequence, the first signal or read start signal provided by the amplifier 380 of the target component 160 reaches the first driver circuit 100-1 last, whereas the last driver circuit 100-64 is reached by the first signal first. As each of the driver circuit 100 provides its respective output signal upon reception of the first signal (neglecting a possible internal delay of the driver circuits 100), the first driver circuit 100-1 provides the corresponding output signal last, wherein the last driver circuit 100-64 provides the output signal first. As, furthermore, the distance or length of the output signal line 130-1 (not shown in FIG. 2) is the longest and the length of the output signal line 130-64 (not shown in FIG. 2) is the shortest, the skew of the data bus or parallel bus 140 is significant.

To obtain an estimate for the skew of the different output signals on the parallel bus 140, it should be noted that the distances or lengths between the receiving end 150 of the parallel bus 140 and the respective driver circuits 100, are at least with respect to the section of the parallel bus 140 in which the individual output signal lines 130 run in parallel (in FIG. 1a to 1c referred to as second section 200), differ substantially for the first driver circuit 100-1 and the last driver circuit 100-64 in the case of N=64 driver circuits 100 and output signal lines 130. While the distance d is in the range between a few micrometers and a few hundred micrometers, (e.g., 5 µm≦d≦500 µm), whereas a typical length D of the memory array 260 along the parallel bus 140 is in the range of several hundred micrometers to several millimeters, typically in the range of 500 µm to 10 mm. Both lengths are shown in FIG. 2.

Considering N individual driver circuits 100 along with N individual output signal lines 130, the skew of the data bus is given by $$\text{Skew(DataBus)} = t(\text{DataBus}<N-1>) - t(\text{DataBus}<0>) \quad (1)$$

wherein t(DataBus<N−1>) is the time required for the corresponding output signal of the first driver circuit 100-1 (bit address (N−1)) to arrive at the receiving end 150 of the parallel bus 140, after sending the read start signal. Accordingly, t(DataBus<0>) is the same time with respect to the last driver circuit 100-N or 100-64 in the possible solution shown in FIG. 2 for N=64 (bit address 0).

The corresponding time t of these two signals are given by the sum of the times the first signal or read start signal requires to reach the corresponding driver circuit 100 and the time the corresponding output signal provided by the corresponding driver circuit 100 requires to travel back along the corresponding output signal line 130 of the parallel bus 140. Assuming that all driver circuits 100 exhibit the same internal delay caused by their respective circuitry, the internal delays can be neglected, as in equation (1) by subtracting the two times t from each other, the contribution of the internal delay is cancelled.

As, furthermore, the signal velocity can be approximated by the RC-time of the respective signal lines, wherein R is the resistance and C is the capacity value of the corresponding signal line, the two times t from equation (1) are given by $$t(\text{DataBus}<N-1>) \cdot R^*C(\text{ReadStart}@D) + R^*C(\text{DataBus}<63>@D) \quad (2)$$

and $$t(\text{DataBus}<0>) \cdot R^*C(\text{ReadStart}@d) + R^*C(\text{DataBus}<0>@d) \quad (3)$$

wherein it is assumed that the resistance values R and the capacity values C are identical for all signal lines shown in FIG. 2. Equation (2) furthermore comprises a further approximation. As the length D of the memory array 260 is often significantly larger than the distance d from the receiving end 150 to the last driver circuit 100-64 in FIG. 2, the overall distance of the first driver circuit 100-1 from the receiving end 150 can be approximated by the length D of the memory array 260, according to $$D + d \approx D, \quad (4)$$

as for example, the length d between the receiving end 150 and the last driver circuit 100 is in the range of a few 10 micrometers (for example d=50 µm) and the length of the memory array 260 is typically in the range of a few millimeters (for example, D=3 mm).

However, this possible or current solution has no special method to reduce the skew on the bus 140. As a consequence, the tracking of the signal, which indicates in the case of a read process that the read process is finished with the bus, is not optimal. Hence, very often elaborate synchronization schemes comprising buffers, are required to be implemented for the system to work at higher speeds (in the range of several 100 MHz to several GHz).

Figure 3:
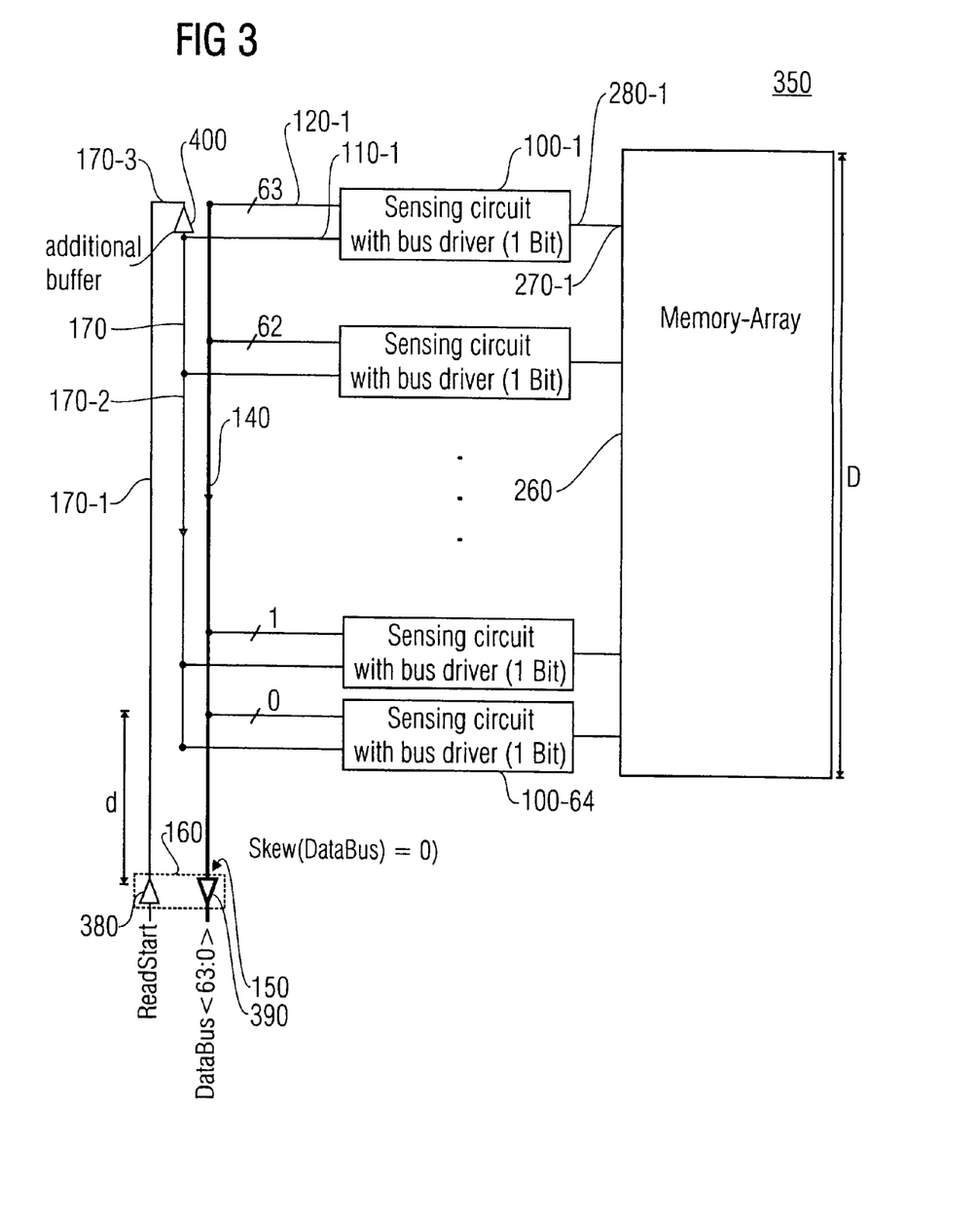
FIG. 3 shows a block diagram of a further embodiment of a memory chip.

FIG. 3 shows a block diagram of a further embodiment of a memory chip 350 and represents a new scheme compared to the old scheme of a possible solution shown in FIG. 2. The embodiment of the memory chip 350 shown in FIG. 3 differs from the possible solution shown in FIG. 2 mainly with respect to the layout of the signal line 170, which comprises a U-shaped form as described in the context of FIG. 1b. Furthermore, the signal line 170 comprises an optional additional buffer 400 which will be explained in more detail later. Apart from these modifications, the embodiment of the memory chip 350 shown in FIG. 3 does not differ significantly from the possible solution of the memory chip shown in FIG. 2. As a consequence, reference is made to the description of the possible solution shown in FIG. 2 with respect to the structure, arrangement, connections and functional properties and features.

To go into more detail, the signal line 370 from the possible solution in FIG. 2 has been replaced with an essentially U-shaped signal line 170, as it was already described in the context of FIG. 1. In other words, the signal line 170 comprises in principle two sections 170-1 connecting the output of the amplifier 380 of the target component 160 running essentially in parallel to the parallel bus 140 providing the read start signal or first signal essentially to the farthest point from the receiving end 150 of the parallel bus 140. A second section 170-2 essentially runs in parallel to the parallel bus 140 or rather to its output signal lines 130 (not individually shown in FIG. 3) connecting the driver circuits 100-1 to 100-64 for the case of a N=64 bit wide parallel bus 140 in the connection order as defined by the decreasing lengths of the output signal lines 130. The first and the second sections of the signal line 170 are interconnected by a third section 170-3, which runs essentially perpendicular to the sections 170-1 and 170-2.

Due to the layout of the signal line 170, the read start signal (first signal) is provided to the driver circuits 100 (sensing circuit with bus driver (1 bit)) according to the connection order as defined by the decreasing lengths between the receiving end 150 of the parallel bus 140 and the respective driver circuit 100, as defined in the context of FIGS. 1a to 1c and FIG. 2. As a consequence, the read start signal is first provided to the farthest driver circuit from the receiving end 150, which is the first driver circuit 100-1. The read start signal or first signal, however, reaches the last driver circuit 100-64 in the case of an N=64 bit wide parallel bus 140 last. As a consequence, the direction of the signal propagation on the signal line 170, or to be more precise, along the second section 170-2 of the signal line 170 comprises the same direction as the signal propagation direction along the individual output signal lines 130 of the parallel bus 140. Hence, the skew of the signal propagation along the parallel bus is significantly reduced as the driver circuit positioned farthest away from the receiving end receives the triggering signal in the form of the read start, first, whereas the driver circuit 100-64 positioned closest to the receiving end receives the signal last.

As with the rest of the driver circuits, driver circuits 100 are connected to the signal line 170 in the connection order as previously defined, the general rule applies that the farther the driver circuit 100 is located along the parallel bus 140, the sooner the driver circuit 100 is provided with the read start signal (first signal). As a consequence, the skew on the parallel bus or data bus 140 is significantly reduced and, under ideal circumstances, completely avoided.

Further assuming that, as it was done in the context of the possible solution shown in FIG. 2, the resistance values R and the capacity values C of the signal lines involved (second section of the signal line 170-2 and the output signal lines 130 of the parallel bus 140) are identical or approximately identical, the read start signal and the output signals on the parallel bus 140 travel, apart from an offset caused by the internal delays of the driver circuits 100 and other constant delays in parallel towards the receiving end 150 and hence, towards the target component 160.

This results in the skew of the databus being significantly reduced. It can even almost completely vanish, although the dimensions, length and distances are equal to that of the possible solution shown in FIG. 2. In other words, the lengths and distances d,D can be chosen to be identical in the framework of the embodiment of a memory chip 350 shown in FIG. 3 compared to those values for the possible solution shown in FIG. 2, while the skew vanishes under ideal circumstances completely. In reality, the skew is of course only significantly reduced, as equation (5) shows.

$$\text{Skew(DataBus)} \approx 0. \quad (5)$$

Once again, the driving direction of the read start signal or first signal along the signal line 170 is rotated by 180° so that the read start signal comprises the same propagation direction or same direction like the (output) signals on the parallel bus or databus 140.

As previously mentioned the second section 170-2 of the signal line 170 comprises an additional buffer 400, which is introduced to the second section of the signal line 170-2 before the first driver circuit 100-1 is connected to the signal line 170 via its input 110-1. In other words, the additional buffer 400 comprises an output, which is connected to the input 110-1 of the first driver circuit 100-1 (bit address 63=(N−1)).

The additional buffer 400 in the signal line 170 is integrated into the embodiment of the memory chip shown in FIG. 3 to improve the signal quality of the read start signal. However, it is an optional component which is, depending on the size of the memory chip, especially the length of the memory array 260, not required to be implemented to achieve the reduction of the skew as described before. To be more precise, the challenge of reducing the skew on the parallel bus 140 is achieved by changing the direction of the read start signal in the embodiment shown in FIG. 3 so that the read start signal progresses along the second section 170-2 of the signal line 170 in the same direction as the output signals on the databus 140 as indicated by the arrows during a read operation (READ), as defined by the connection order.

To put it in more general terms, the spatial location of a read-start-driver is moved to the farthest point along the parallel bus 140. The additional buffer 400 takes over the functionality of the amplifier 380 of the possible solution as shown in FIG. 2. However, to ensure the signal quality, the amplifier 380 has not been removed from the embodiment shown in FIG. 3 although it is not a necessary component, but an optional one.

Basically, the change of the direction of the read start signal can be implemented with or without the additional buffer, depending on the length of the signal line 170, the length of the databus 140 and the length of the memory array 260. However, the implementation of the additional buffer 400 for the read start signal at the edge of the memory array 260 also reduces the skew of the databus significantly.

In other words, embodiments of the present invention as described before, provide a bus concept for a distributed bus driver system with a reduced skew in memory system, like DRAM circuits. Especially in the field of high-speed memory and DRAM circuits, embodiments of the present invention can be employed. Implementations of the embodiments for instance, in the form of chip hardware has proved the usefulness of the embodiments described above, as they show an excellent performance.

Although the embodiments of the present invention have so far been discussed in terms of electrical signals, embodiments of the bus structure, a memory chip and an integrated circuit are not necessarily limited to electrical signals. Also other forms of signal transmission can be employed, such as optical signals including an infrared transmission and an ultraviolet transmission along optical wave guides, which also suffer from the same challenge and other forms of signal transmission suffering from a skew of signals sent in parallel. In these cases light diodes, such as laser diodes, can be used as signal sources or "driver circuits", while the photosensors and photodiodes can be employed as detectors.

While the foregoing has been particularly shown and described with reference to particular embodiments thereof, it will be understood by those skilled in the art that various other changes in the form and details may be made without departing from the spirit and scope thereof. It is to be understood that various changes may be made in adapting to different embodiments without departing from the broader concepts disclosed herein and comprehended by the claims that follow.

What is claimed is:

1. A bus structure, comprising:
    a plurality of driver circuits, each driver circuit comprising an input for a first signal and a terminal for an output signal, wherein each driver circuit is capable of providing the output signal at the terminal upon receipt of the first signal;
    a parallel bus comprising a plurality of output signal lines at a receiving end being connectable to a target component, each of the output signal lines extending at least from the receiving end to the terminal of a different one of the plurality of driver circuits such that a length of the output signal line between the receiving end and the respective driver circuit of the plurality of driver circuits decreases in a connection order among the plurality of driver circuits; and
    a signal line coupled to each of the inputs of the driver circuits of the plurality of driver circuits in the connection order.

2. The bus structure according to claim 1, wherein the bus structure is integrated into a single chip.

3. The bus structure according to claim 2, wherein the receiving end is coupled to the target component, and wherein the target component is part of an interface for chip-external communication.

4. The bus structure according to claim 1, wherein the length of the signal line between two different driver circuits of the plurality of driver circuits corresponds to a difference of the lengths of the output signal lines with respect to the receiving end of the respective driver circuits.

5. The bus structure according to claim 1, wherein a signal propagation delay of the first signal on the signal line between two different driver circuits of the plurality of driver circuits corresponds to a difference of signal propagation delays between the respective driver circuits and the receiving end.

6. The bus structure according to claim 1, wherein at least a section of each of the output signal lines of the parallel bus are arranged parallel and neighboring, with respect to each other, and wherein at least a section of the signal line is parallel and neighboring to the sections of the plurality of output signal lines.

7. The bus structure according to claim 6, wherein the signal line further comprises a further section coupled to the section of the signal line such that the section of the signal line and the further section of the signal line form a U-shaped structure.

8. The bus structure according to claim 1, further comprising a buffer with an input for a first initial signal and an output for the first signal derived from the first initial signal comprising an improved signal quality, coupled into the signal line before the first driver circuit in the connection order.

9. The bus structure according to claim 1, further comprising a memory array with a plurality of memory array terminals, wherein each driver circuit of the plurality of driver circuits further comprises a further terminal coupled to one of the memory array outputs of the plurality of memory array terminals of the memory array.

10. The bus structure according to claim 9, wherein the first signal is a read start signal and wherein the parallel bus is a data bus.

11. The bus structure according to claim 9, wherein each of the driver circuits of the plurality of driver circuits further comprises a sensing circuit such that the driver circuit is capable of providing a signal at the further terminal to the memory array based on a signal received at the terminal of the driver circuit.

12. The bus structure according to claim 9, wherein the memory array is a DRAM array.

13. A memory chip, comprising:
a memory array with a plurality of memory array terminals;
a plurality of driver circuits, each driver circuit comprising an input for a first signal, a terminal for an output signal and a further terminal coupled to one memory array terminal of the plurality of memory array terminals such that each driver circuit of the plurality of driver circuits is coupled to a respective memory array terminal of the plurality of memory array terminals, wherein each driver circuit is capable of providing the output signal at the terminal upon receipt of the first signal;
a parallel data bus comprising a plurality of output signal lines and a receiving end being connectable to a target component, each output signal line extending at least from the receiving end to the terminal of a different one of the plurality of driver circuits such that a length of the output signal line between the receiving end and the respective driver circuit of the plurality of driver circuits decreases in a connection order among the plurality of driver circuits; and
a signal line coupled to each of the inputs of the driver circuits of the plurality of driver circuits in the connection order;
wherein the memory chip is integrated into a single chip.

14. The memory chip according to claim 13, wherein the parallel data bus is connected to the target component, wherein the target component is part of an interface for a chip-external communication.

15. The memory chip according to claim 13, wherein a length of the signal line between different driver circuits of the plurality of driver circuits corresponds to a difference of the lengths of the output signal lines of the respective driver circuits with respect to the receiving end.

16. The memory chip according to claim 13, wherein a signal propagation delay of the first signal on the signal line between two different driver circuits of the plurality of driver circuits corresponds to a difference of the signal propagations of the respective output signals on the respective output signal lines between the respective driver circuits of the plurality of driver circuits and the receiving end.

17. The memory chip according to claim 13, further comprising a buffer with an input for a first initial signal and an output for the first signal derived from the first initial signal comprising an improved signal quality, the output coupled into the signal line before the first driver circuit of the plurality of driver circuits according to the connection order.

18. The memory chip according to claim 13, wherein each driver circuit of the plurality of driver circuits further comprises a sensing circuit such that each of the driver circuits is capable of providing a signal at the further terminal to the memory array based on a signal received at the terminal of the respective driver circuits, and wherein the first signal is a read start signal.

19. The memory chip according to claim 13, wherein the memory array is DRAM memory array and the memory chip is a DRAM memory chip.

20. An integrated circuit, comprising:
a plurality of driver circuits, each driver circuit comprising an input for a first signal and a terminal for an output signal, wherein each driver circuit is capable of providing the output signal at the terminal upon receipt of the first signal;
a target component that is part of an interface for an external communication;
a parallel bus comprising a plurality of output signal lines with a receiving end being coupled to the target component, each of the signal lines extending at least from the receiving end to the terminal of a different one of the plurality of driver circuits such that a length of the output signal line between the receiving end and the respective driver circuit of the plurality of driver circuits decreases in a connection order among the plurality of driver circuits; and
a signal line coupled to each of the inputs of the driver circuits of the plurality of the driver circuits in the connection order;
wherein a length of the signal line between different driver circuits of the plurality of driver circuits corresponds to a difference of the lengths of the respective driver circuits with respect to the receiving end such that the signal propagation time of the first signal on the signal line between two different driver circuits of the plurality of driver circuits corresponds to a difference of the propagation delays of the respective output signals on the respective output signal lines of the respective driver circuits.

21. The integrated circuit according to claim 20, further comprising a buffer with an input for a first initial signal and an output for the first signal derived from the first initial signal comprising an improved signal quality, coupled into the signal line before the first driver circuit according to the connection order.

22. The integrated circuit according to claim 20, wherein at least sections of the output signal lines of the parallel bus and at least a section of the signal line are neighboring and arranged in parallel with respect to each other, and wherein the signal line further comprises a further section of a signal line such that the section of the signal line and the further section of the signal line form a U-shaped structure.

23. The integrated circuit according to claim 20, wherein the integrated circuit is integrated into a single chip, and wherein the interface is an interface for a chip-external communication.

* * * * *